(12) United States Patent
Damgaard et al.

(10) Patent No.: US 6,633,751 B1
(45) Date of Patent: Oct. 14, 2003

(54) SYSTEM FOR A DUAL FEEDBACK TRANSLATION LOOP FOR POWER AMPLIFIER FEEDBACK CONTROL

(75) Inventors: Morten Damgaard, Laguna Hills, CA (US); William J. Domino, Yorba Linda, CA (US); Nooshin D. Vakilian, Irvine, CA (US); Dmitriy Rozenblit, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 525 days.

(21) Appl. No.: 09/666,577

(22) Filed: Sep. 21, 2000

(51) Int. Cl.[7] .................... H01Q 11/12; H04B 1/04

(52) U.S. Cl. ................... 455/126; 455/127.2

(58) Field of Search ............... 455/126, 127.1, 455/115, 522, 127.2; 375/295; 330/278, 291

(56) References Cited

U.S. PATENT DOCUMENTS

| | | | | |
|---|---|---|---|---|
| 5,126,686 A | * | 6/1992 | Tam ...................... | 330/134 |
| 5,507,017 A | * | 4/1996 | Whitmarsh et al. ......... | 455/126 |
| 6,191,653 B1 | * | 2/2001 | Camp et al. ............... | 330/129 |

* cited by examiner

*Primary Examiner*—Nguyen T. Vo
(74) *Attorney, Agent, or Firm*—Needle & Rosenberg, P.C.

(57) ABSTRACT

A system for controlling a power amplifier using a dual feedback translation loop uses the output of the translation loop during a first time period where a power amplifier has insufficient power to lock the loop and uses the output of the power amplifier to lock the translation loop only after the power amplifier provides sufficient power. By using a first feedback loop taken from the output of the translation loop and a second feedback loop taken from the output of the power amplifier, the translation loop can lock to the output of the translation loop until the power output of the power amplifier is sufficient to lock the translation loop. A pair of phase detectors and corresponding charge pumps associated with each of the feedback loops provides a smooth switching function while transitioning from the first loop to the second loop.

40 Claims, 5 Drawing Sheets

SYSTEM FOR A DUAL FEEDBACK TRANSLATION LOOP FOR POWER AMPLIFIER FEEDBACK CONTROL

CROSS REFERENCE TO RELATED APPLICATIONS

The following and commonly assigned U.S. Patent application has been filed on the same day as this application. This application relates to and further describes other aspects of the embodiments disclosed in this application and is incorporated by reference in its entirety.

U.S. patent application Ser. No. 09/666,698. "SYSTEM FOR MULTIPLE STEP SWITCHED TRANSLATION LOOP FOR POWER AMPLIFIER FEEDBACK CONTROL," filed on Sep. 21, 2000.

BACKGROUND OF THE INVENTION

1. Technical Field

This invention relates generally to maximizing radio frequency transmission power in a wireless communication device transmitter, and, more particularly, to a system for a dual feedback translation loop for power amplifier feedback control.

2. Related Art

With the increasing availability of efficient, low cost electronic modules, mobile communication systems are becoming more and more widespread. For example, there are many variations of communication schemes where various frequencies, transmission schemes, modulation techniques and communication protocols are used to provide two-way voice and data communications in a handheld telephone-like communication handset. The different modulation and transmission schemes each have advantages and disadvantages.

As these mobile communication systems have been developed and deployed, many different standards, to which these systems must conform, have evolved. For example, in the United States, portable communications systems complying with the IS-136 standard specify the use of a particular modulation scheme and access format. In the case of IS-136, the modulation scheme can be 8-quadrature phase shift keying (8QPSK), offset π/4 differential quadrature phase shift keying (π/4-DQPSK) or variations and the access format is time division multiple access (TDMA). Other standards may require the use of, for example, code division multiple access (CDMA).

Similarly, in Europe, the global system for mobile communications (GSM) standard requires the use of the gaussian minimum shift keying (GMSK) modulation scheme in a narrowband TDMA access environment. In a typical GSM mobile communication system using narrowband TDMA technology, a GMSK modulation scheme supplies a very clean phase modulated (PM) transmit signal to a non-linear power amplifier directly from an oscillator. In such an arrangement, a highly efficient, non-linear power amplifier can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS-136, however, use a modulation scheme in which the transmitted signal is both phase modulated (PM) and amplitude modulated (AM). Standards such as these increase the data rate without increasing the bandwidth of the transmitted signal.

Unfortunately, existing GSM radio transmitters are not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the input of the power amplifier.

When attempting to include a PM component and an AM component in a GSM type modulation system, the power control loop will tend to fight against the amplitude variations present in the signal while attempting to maintain the desired output power. In such an arrangement, the power control loop tends to cancel the AM portion of the signal.

In such systems in which transmit signals contain both PM and AM components, the output power can be controlled by setting a calibrated control signal on the power amplifier. Unfortunately, this requires the use of a highly linear, and therefore very inefficient, power amplifier. In non-burst transmission systems the output power may be controlled by a feedback loop having a time-constant that is very low compared to the time-constant of the amplitude variations of the modulator. Another known method to control the output power is to "pre-distort" the modulated signal in such a way that the power control loop will cancel the effect of the pre-distortion. In such a method, the amplitude information is passed through a transfer function that is the inverse of the power control loop transfer function. Unfortunately, these methods are costly and inefficient.

In those transmission standards in which both a PM signal and an AM signal are sent to a power amplifier, unless the power amplifier is very linear it may distort the combined transmission signal by causing undesirable AM to PM conversion. This conversion is detrimental to the transmit signal and can require the use of a costly and inefficient linear power amplifier. Indeed, even in systems in which only a phase modulated component is amplified, phase distortion in the power amplifier may degrade the phase modulated signal.

With the increasing desirability of developing one worldwide portable communication standard, it would be desirable to allow portable transceivers to transmit a signal containing both a PM component and an AM component, while maximizing the efficiency of the power amplifier. Furthermore, as the GSM standard evolves further, such as with the development of enhanced data rates for GSM evolution (EDGE), it is desirable to have one portable transceiver that may operate in all systems. Further still, in systems in which only a phase modulated signal is transmitted, it would be desirable to eliminate any phase distortion caused by the power amplifier.

SUMMARY

The invention provides a system for a dual feedback translation loop for power amplifier feedback control that maximizes power amplifier efficiency.

The invention provides a dual feedback translation loop for controlling a power amplifier in which during a first time period the output of the translation loop is used as phase control feedback to the translation loop and during a second time period the output of the power amplifier is used as feedback to the translation loop. The feedback from the translation loop is supplied to a first phase detector and the output of the power amplifier is supplied to a second phase detector. Each phase detector also receives as input a modulated transmit signal. The phase difference between the modulated transmit signal and the respective feedback signals are measured by the phase detectors and used to drive first and second charge pumps, respectively coupled to the output of the first and second phase detectors. The charge pumps are configured to operate such that the sum of the currents during the phase correction pulses from the two charge pumps is constant, thus providing a smooth switching function between the output of the translation loop and the output of the power amplifier supplied as feedback to the translation loop. During transition from one charge pump to the other, the current pulses from the first charge pump become weaker, while the current pulses from the second charge pump become stronger until the transition is complete.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale relative to each other, emphasis instead being placed upon clearly illustrating the principles of the invention. Moreover, in the figures, like reference numerals designate corresponding parts throughout the different views.

DETAILED DESCRIPTION

Figure 1:
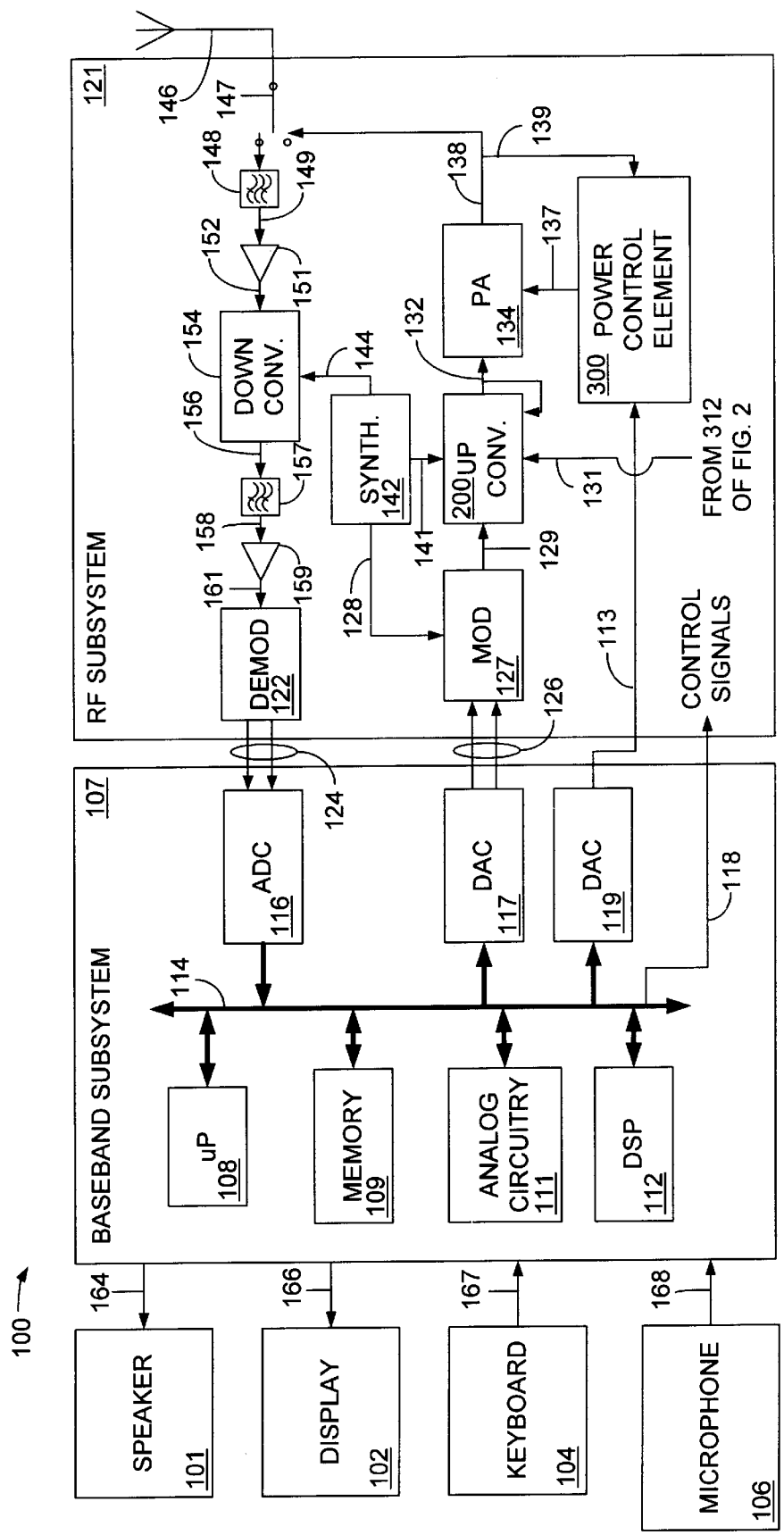
FIG. 1 is a block diagram illustrating a simplified portable transceiver.

Although described with particular reference to a portable transceiver, the dual feedback translation loop system of the invention can be implemented in any system in which it is desirable to eliminate phase distortion in a power amplifier. Furthermore, the dual feedback translation loop system is applicable to any system in which it is desirable to implement a closed power control feedback loop and in which a PM signal and an AM signal are supplied to a linear power amplifier.

The dual feedback translation loop system of the invention can be implemented in software, hardware, or a combination thereof. In a preferred embodiment(s), selected portions of the dual feedback translation loop system are implemented in hardware and software. The hardware portion of the invention can be implemented using specialized hardware logic. The software portion can be stored in a memory and be executed by a suitable instruction execution system (microprocessor). The hardware implementation of the dual feedback translation loop system can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The dual feedback translation loop software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100. Portable transceiver 100 includes speaker 101, display 102, keyboard 104, and microphone 106, all connected to baseband subsystem 107. In a particular embodiment, portable transceiver 100 can be, for example but not limited to, a portable telecommunication handset such as a mobile cellular-type telephone. Speaker 101 and display 102 receive signals from baseband subsystem 107 via connections 164 and 166, respectively, as known to those skilled in the art. Similarly, keyboard 104 and microphone 106 supply signals to baseband subsystem 107 via connections 167 and 168, respectively. Baseband subsystem 107 includes microprocessor ($\mu$P) 108, memory 109, analog circuitry 111, and digital signal processor (DSP) 112, in communication via bus 114. Bus 114, although shown as a single bus, may be implemented using multiple busses connected as necessary among the subsystems within baseband subsystem 107. Microprocessor 108 and memory 109 provide the signal timing, processing and storage functions for portable transceiver 100. Analog circuitry 111 provides the analog processing functions for the signals within baseband subsystem 107. Baseband subsystem 107 provides control signals to radio frequency (RF) subsystem 121 via connection 118. Although shown as a single connection 118, the control signals may originate from DSP 112 or from microprocessor 108, and are supplied to a variety of points within RF subsystem 121. It should be noted that, for simplicity, only the basic components of portable transceiver 100 are illustrated herein.

Baseband subsystem 107 also includes analog-to-digital converter (ADC) 116 and digital-to-analog converters (DACs) 117 and 119. ADC 116, DAC 117 and DAC 119 also communicate with microprocessor 108, memory 109, analog circuitry 111 and DSP 112 via bus 114. DAC 117 converts the digital communication information within baseband subsystem 107 into an analog signal for transmission to RF subsystem 121 via connection 126. DAC 119 provides a reference voltage power level signal to power control element 300 via connection 113. Connection 126, while shown as two directed arrows, includes the information that is to be transmitted by RF subsystem 121 after conversion from the digital domain to the analog domain.

RF subsystem 121 includes modulator 127, which after receiving a frequency reference signal (also called a "local oscillator" signal, or "LO") from synthesizer 142 via connection 128, modulates the received analog information and provides a phase modulated signal via connection 129 to upconverter 200. Upconverter 200 also receives a frequency reference signal from synthesizer 142 via connection 141. Synthesizer 142 determines the appropriate frequency to which upconverter 200 will upconvert the phase modulated signal on connection 129.

Upconverter 200 supplies the phase modulated signal via connection 132 to power amplifier 134. Power amplifier 134 amplifies the modulated signal on connection 132 to the appropriate power level for transmission via connection 138 to antenna 146. Illustratively, switch 147 controls whether the amplified signal on connection 138 is transferred to antenna 146 or whether a received signal from antenna 146 is supplied to filter 148. The operation of switch 147 is controlled by a control signal from baseband subsystem 107 via connection 118.

A portion of the amplified transmit signal on connection 138 is supplied via connection 139 to a linear power amplifier (to be described below with respect to FIG. 2) via connection 140 (FIG. 2) and to power control element 300 via connection 139. The power control element 300 supplies the control input to the linear power amplifier. The linear power amplifier supplies a feedback signal via connection 131 to the upconverter 200. In addition, a portion of the output of the upconverter 200 is supplied via connection 132 back to the upconverter. The feedback from the upconverter forms a first feedback loop and the feedback from the power amplifier forms a second feedback loop. The two feedback loops are controlled via a pair of phase detectors and corresponding charge pumps (to be described in detail with respect to FIG. 2) located in the upconverter. Prior to transmitting, it is desirable to lock the translation loop formed by the upconverter 200 with the input signal to the power amplifier 134 and, after transmission has begun, to lock the translation loop with a signal taken from the output of the power amplifier 134.

In the RF subsystem 121, a signal received by antenna 146 will, at the appropriate time determined by baseband system 107, be directed via switch 147 to receive filter 148. Receive filter 148 filters the received signal and supplies the filtered signal on connection 149 to low noise amplifier (LNA) 151. Receive filter 148 is a bandpass filter, which passes all channels of the particular cellular system in which the portable transceiver 100 is operating. As an example, for a 900 MHz GSM system, receive filter 148 would pass all frequencies from 935.1 MHz to 959.9 MHz, covering all 124 contiguous channels of 200 kHz each. The purpose of this filter is to reject all frequencies outside the desired region. LNA 151 amplifies the very weak signal on connection 149 to a level at which downconverter 154 can translate the signal from the transmitted frequency back to a baseband frequency. Alternatively, the functionality of LNA 151 and downconverter 154 can be accomplished using other elements, such as for example but not limited to, a low noise block downconverter (LNB).

Downconverter 154 receives a frequency reference signal (also called a "local oscillator" signal or "LO") from synthesizer 142, via connection 144, which signal instructs the downconverter 154 as to the proper frequency to which to downconvert the signal received from LNA 151 via connection 152. The downconverted frequency is called the "intermediate frequency" or "IF." Downconverter 154 sends the downconverted signal via connection 156 to channel filter 157, also called the "IF filter." Channel filter 157 filters the downconverted signal and supplies it via connection 158 to amplifier 159. The channel filter 157 selects the one desired channel and rejects all others. Using the GSM system as an example, only one of the 124 contiguous channels is actually to be received. After all channels are passed by receive filter 148 and downconverted in frequency by downconverter 154, only the one desired channel will appear precisely at the center frequency of channel filter 157. The synthesizer 142, by controlling the local oscillator frequency supplied on connection 144 to downconverter 154, determines the selected channel. Amplifier 159 amplifies the received signal and supplies the amplified signal via connection 161 to demodulator 122. Demodulator 122 recovers the transmitted analog information and supplies a signal representing this information via connection 124 to ADC 116. ADC 116 converts these analog signals to a digital signal at baseband frequency and transfers it via bus 114 to DSP 112 for further processing.

Figure 2:
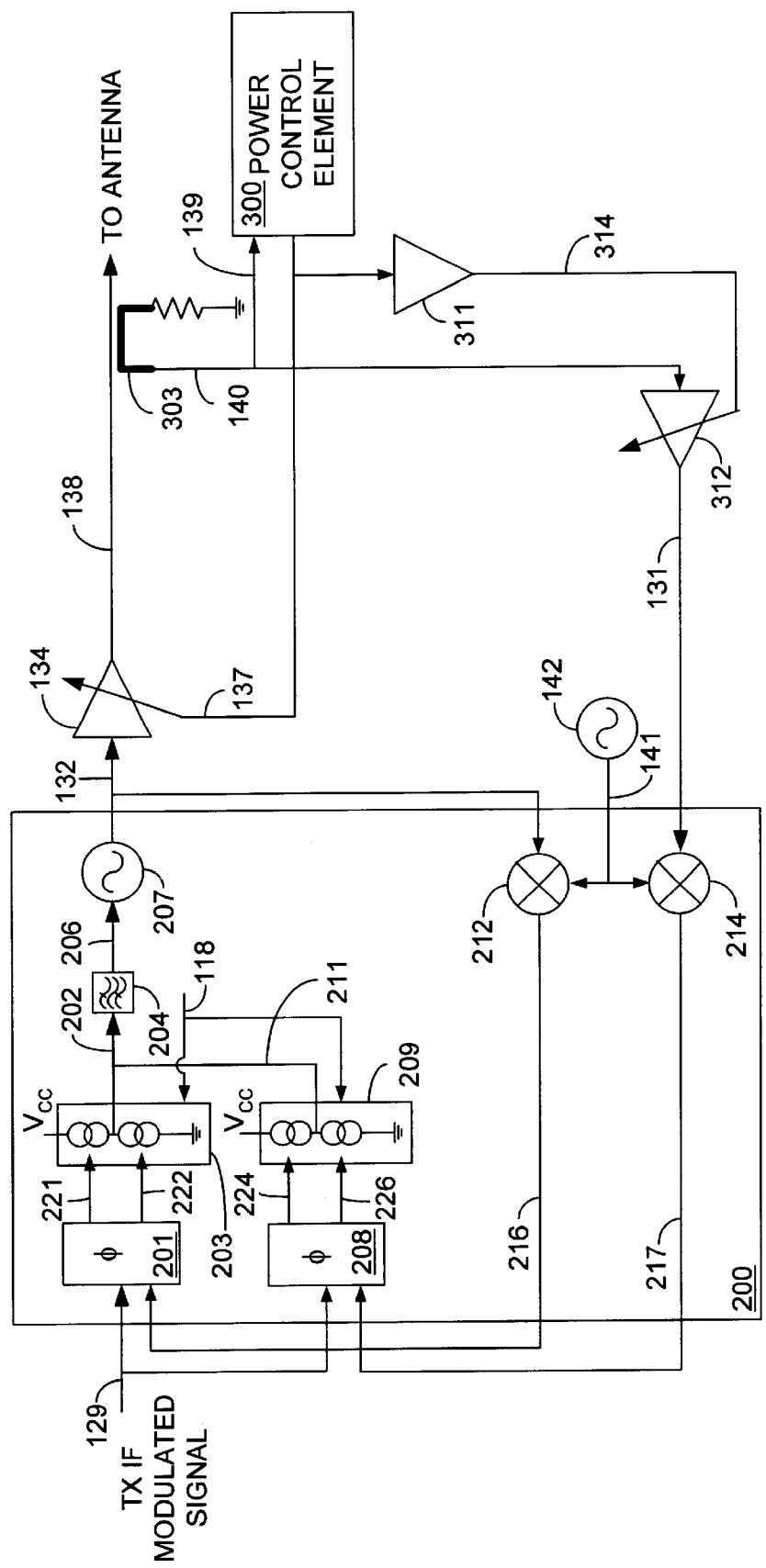
FIG. 2 is a block diagram illustrating the upconverter of FIG. 1 and the dual feedback translation loop of the invention.

FIG. 2 is a block diagram illustrating the upconverter 200 and the dual feedback translation loop of the invention. In one embodiment, the upconverter 200 receives an intermediate frequency (IF) modulated signal on connection 129 from modulator 127 (FIG. 1). The IF modulated signal on connection 129 is, for example purposes only, a phase modulated signal. The phase modulated signal is supplied on connection 129 simultaneously to phase detector 201 and phase detector 208. Phase detector 201 compares the phase of the signals on connections 129 and 216 and phase detector 208 compares the phase of the signals on connections 129 and 217. The operation of the phase detectors will be described below. The output of phase detector 201 is supplied via connections 221 and 222 to charge pump 203. Similarly, the output of phase detector 208 is supplied via connections 224 and 226 to charge pump 209.

During a period corresponding to the ramp up of power amplifier 134, and prior to transmitting a signal, charge pump 203 provides current pulses as output on connection 202. The pulse width of these pulses is proportional to the phase difference between the signals on connections 129 and 216.

During this initial ramp up, the feedback for the translation loop formed by upconverter 200 is taken from the output of the upconverter 200 on connection 132. After the power amplifier 134 has gained sufficient power so that its output can provide feedback to the translation loop formed by upconverter 200, the charge pump 209 provides current pulses as output on connection 211. The pulse width of these pulses is proportional to the phase difference between the signals on connections 129 and 217. The control of the charge pumps 203 and 209, to be described in detail below, determines whether the feedback signal to the input of the upconverter is taken from the output of the upconverter 200 or the output of the power amplifier 134.

The outputs of charge pumps 203 and 209 are sent via connection 202 to loop filter 204. Loop filter 204 filters the signal on connection 202 and passes a signal at the appropriate frequency on connection 206 to transmit (TX) voltage controlled oscillator (VCO) 207. TX VCO 207 supplies a very clean modulated signal (i.e., a signal with very low out-of-band noise) via connection 132 to power amplifier 134. By using a voltage controlled oscillator 207 to supply a low-noise modulated signal to power amplifier 134, the need for filtering before and after the power amplifier 134 may be reduced or eliminated. The signal supplied from oscillator 207 to power amplifier 134 contains only a phase modulated signal.

During the time period in which the power amplifier 134 is ramping up, but still providing insufficient power with which to close a feedback loop, a portion of the output of TX VCO is supplied via connection 132 to mixer 212. Mixer 212 combines the frequency reference signal, also known as the local oscillator, from the synthesizer 142 via connection 141 in order to provide the proper up-converted transmit frequency on connection 216 to phase detector 201. In this manner, synthesizer 142 and mixer 212 ensure that the frequency of the signal output from TX VCO 207 on connection 132 tracks that of the local oscillator signal supplied by synthesizer 142. The combination of the output of TX VCO 207 with the output of synthesizer 142, supplied through mixer 212 via connection 216 forms a first feedback loop, which is used to determine the transmit frequency to which the signal input on connection 129 is upconverted. In this manner, the translation loop formed by up converter 200 can achieve lock before the power amplifier 134 is capable of providing sufficient output power. The phase detector 201 detects any phase difference between the input signal on connection 129 and the feedback signal on connection 216 and provides an output via connections 221 and 222 to drive charge pump 203. Charge pump 203 develops an output current that is proportional to the difference in phase of the signals on connections 129 and 216 and provides this current output via connection 202 to loop filter 204.

After the power amplifier 134 has developed sufficient power to provide an output signal on connection 138, a portion of the output power on connection 138 is supplied through coupler 303 via connection 140 to linear RF amplifier 312. Coupler 303 removes a small portion of the output power on connection 138. In addition, a portion of the output power on connection 138 is also supplied via connection 139 to power control element 300. Power control element 300 provides a power control feedback loop for power amplifier 134, and can be used, if desired, to introduce an amplitude modulated (AM) signal to the control channel power amplifier 134 via connection 137.

The output of power control element 300 is also supplied to inverting amplifier 311, which inverts the signal supplied over connection 137. The output of inverting amplifier 311 is supplied via connection 314 to the control channel of linear RF amplifier 312. Linear RF amplifier 312 is used as a feedback amplifier to provide a constant amplitude signal on connection 131 for input to mixer 214 during the time that the feedback signal to upconverter 200 is taken from the output of the power amplifier 134. Alternatively, an AGC (automatic gain control) loop or a limiter can provide the constant amplitude signal for input to mixer 214 instead of the linear RF amplifier 312.

Mixer 214 combines the feedback signal on connection 131 with the transmit reference frequency local oscillator output of synthesizer 142, and supplies a second feedback signal via connection 217 to phase detector 208. Phase detector 208 compares the phase of the signal on connections 129 and 217 and provides an output signal via connections 224 and 226 to charge pump 209.

The charge pump 209 provides current pulses as output on connection 211. The pulse width of these pulses is proportional to the phase difference of the signals on connections 129 and 217 and the output current during the pulse time is constant (except during transition between charge pumps 203 and 209). In this way, the average output current over a period longer than the pulse period is proportional to the phase difference. It is desirable for the feedback to be taken via loop 217 after the power output of power amplifier 134 reaches a sufficient level. By controlling the charge pumps 203 and 209 so that the output current of charge pump 203 during its output pulses on connection 202 is gradually changed (increased or decreased) and the output current of charge pump 209 during its output pulses on connection 211 is also gradually changed (increased or decreased), a soft switching function is provided. The output currents of charge pumps 203 and 209 are changed in a manner so that the sum of the constant current during the current pulse of each individual charge pump is kept constant.

For example, consider the situation where one charge pump is active and providing 1 mA of current during its pulse times. The other charge pump is inactive, thus providing 0 mA of current. When transition between the two charge pumps begins, the active charge pump will start to decrease its current, and the inactive charge pump will become active and slowly start to increase its current. Midway through the transition each charge pump will deliver 0.5 mA of current during its pulses, and when the transition is complete the charge pump that started as active will have become inactive and the one that was initially inactive will have become active, providing 1 mA of current during its pulses. In this manner, the input to loop filter 204 steadily and controllably transitions from the output of TX VCO 207 through loop 216 to the output of power amplifier 134 through loop 217 when the output of power amplifier 134 becomes sufficient.

Figure 3:
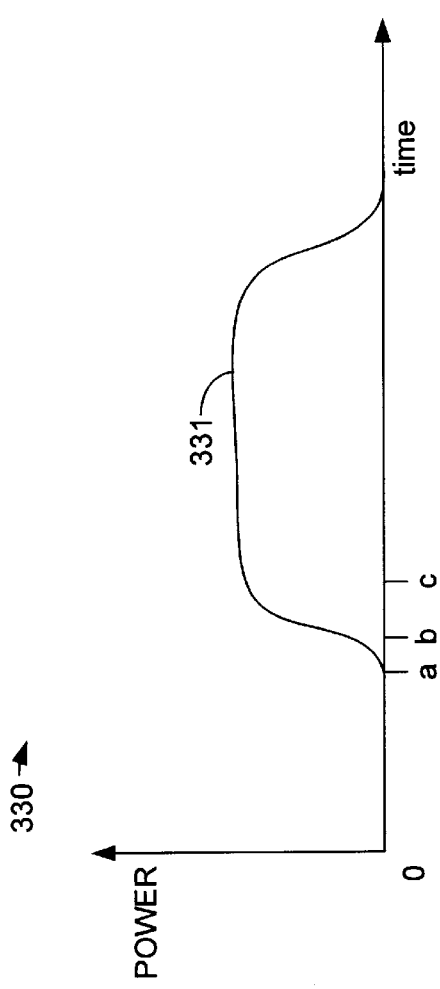
FIG. 3 is a graphical view illustrating the short-term average power output of the power amplifier of FIG. 2.

FIG. 3 is a graphical view illustrating the short term average power output of the power amplifier 134 of FIG. 2. The vertical axis of graph 330 represents average power output of the power amplifier 134 and the horizontal axis of graph 330 represents time. Point "a" represents the point in time at which a transmission burst is initiated. At this time the microprocessor 108 of FIG. 1 applies a control signal via connection 118 to charge pump 203 and charge pump 209, thus ensuring that a significant portion of the power supplied to loop filter 204 (FIG. 2) is supplied by charge pump 203 (i.e., the output of the upconverter 200 via feedback loop 216). During the following ramp up time the translation loop of FIG. 2 tracks only the output of TX VCO 207. Once the output of the power amplifier 134 becomes sufficient to drive the mixer 214 and phase detector 208 through feedback loop 217, represented by point "b" in FIG. 3, the microprocessor 108 of FIG. 1 sends a control signal via connection 118 instructing the charge pumps 203 and 209 to begin transitioning. At this time, there is sufficient power output available from power amplifier 134 so that the input to the loop filter 204 can be taken from the output of the power amplifier 134 via feedback loop 217, thus allowing the synthesizer 142 and mixer 214 to correct any phase distortion present at the output of power amplifier 134. The point "c" in FIG. 3 represents the point at which the power amplifier 134 has ramped up to full output power and transition to charge pump 209 should be completed.

Figure 4:
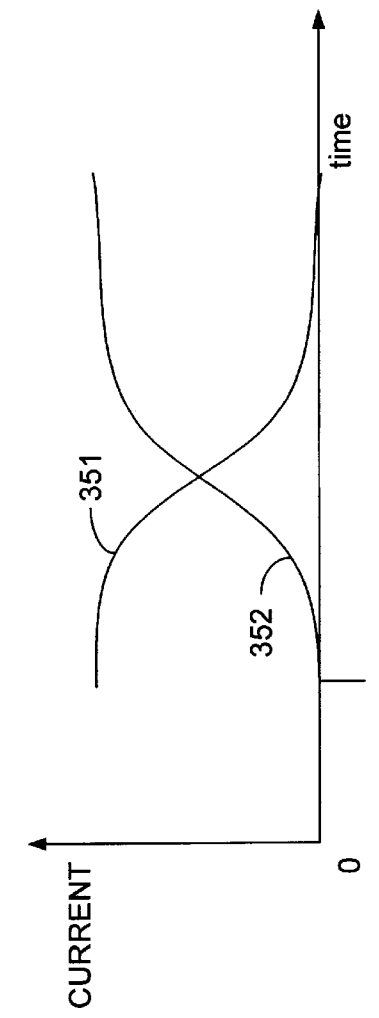
FIG. 4 is a graphical view illustrating the operation of the charge pumps of FIG. 2.

FIG. 4 is a graphical view illustrating the operation of the charge pumps of FIG. 2. The vertical axis of the graph 350 depicts the output current of charge pumps 203 and 209 and the horizontal axis of the graph 350 represents time. As shown, during an initial time "a", the output of charge pump 203, represented by line 351, is at a maximum while the output of charge pump 209, represented by line 352, is at a minimum. At the beginning of a transmit event, as the output of power amplifier 134 (FIG. 2) begins to ramp up, the output of charge pump 203 is reduced and the output of charge pump 209 is increased. By decreasing the output pulse current of charge pump 203 while proportionally increasing the output pulse current of charge pump 209, the sum of the pulse currents of the two charge pumps remains constant as described above. In this manner, a soft switching function is provided between taking the feedback from the output of the upconverter 200 via feedback loop 216 to the output of the power amplifier 134 via feedback loop 217 of FIG. 2.

It may be desirable to have the ability for power amplifier 134 to output a signal including both PM and AM. Unfortunately however, there are many drawbacks associated with supplying a signal with both PM and AM directly to power amplifier 134 via connection 132. For example, in order to amplify the signal in amplifier 134 without phase or amplitude distortion, amplifier 134 should be highly linear. Unfortunately, linear power amplifiers are also very inefficient. A highly linear power amplifier is required to amplify a signal containing both PM and AM in order to prevent undesirable and detrimental AM to PM conversion. AM to PM conversion occurs due to the inherent amplitude-dependence of an amplifier's phase-shift characteristic, which is most severe in the case of highly efficient amplifiers. In such amplifiers, the signal's AM causes the phase to be modulated as the amplifier's phase-shift characteristic varies with the signal amplitude, resulting in a distorted transmit signal. Unfortunately, linear amplifiers, which have low AM to PM conversion, are highly inefficient. Such a system for introducing an AM modulation component into the power amplifier feedback loop is disclosed in commonly assigned, co-pending, cross referenced U.S. Patent Application entitled "SYSTEM FOR MULTIPLE STEP SWITCHED TRANSLATION LOOP FOR POWER AMPLIFIER FEEDBACK CONTROL." Furthermore, even in systems where only one modulation component exists (such as a PM only signal), the invention may be successfully used to eliminate any phase distortion cause by power amplifier 134.

Figure 5:
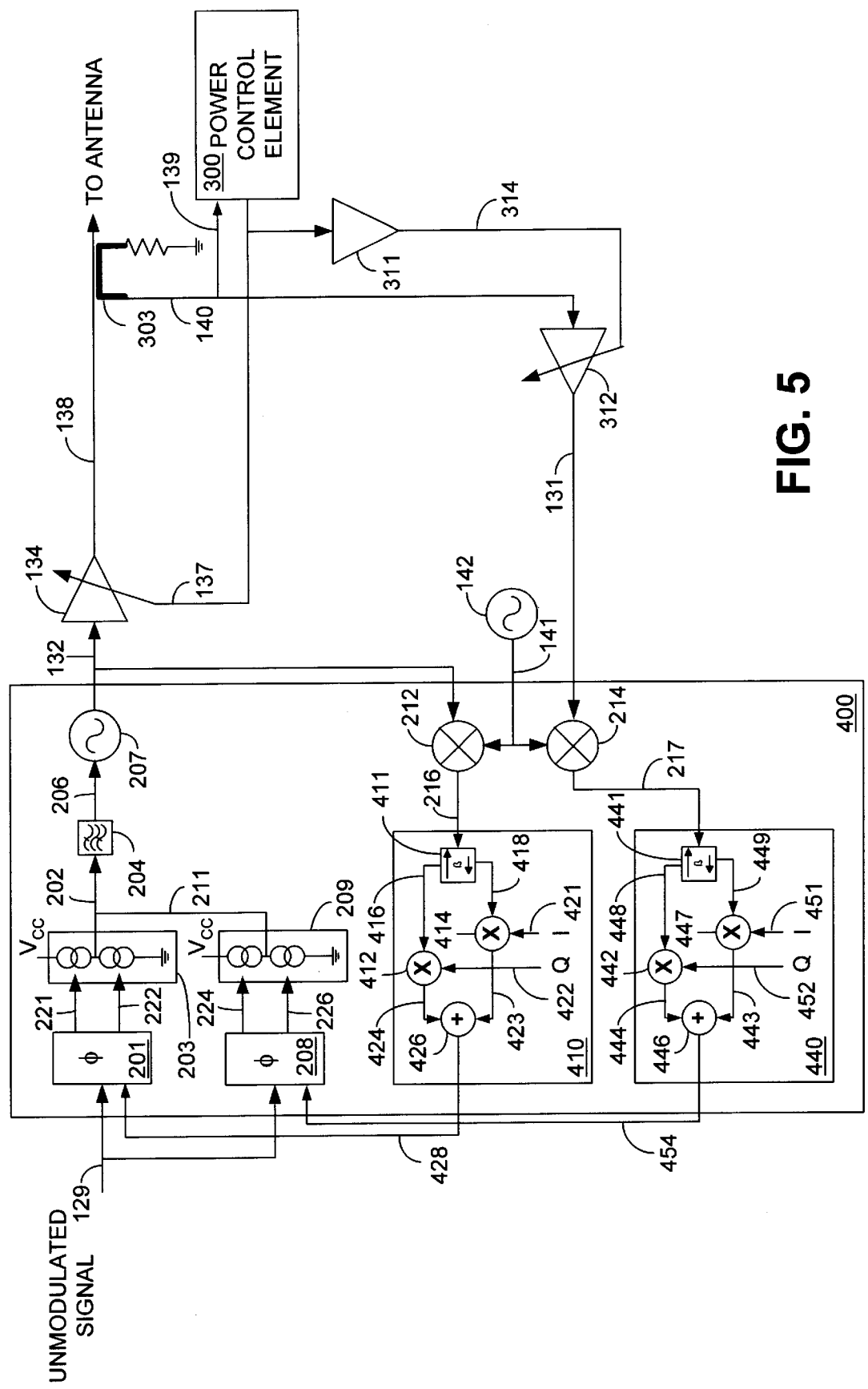
FIG. 5 is a block diagram illustrating another aspect of the upconverter of FIG. 2.

FIG. 5 is a block diagram illustrating another aspect of the upconverter 200 of FIG. 2. Elements that perform the same function as described above in FIG. 2 are like numbered in FIG. 5. Referring now to FIG. 5, the output of mixer 212 is supplied via connection 216 to modulator 410. If modulator 410 is employed, then an unmodulated signal is supplied as input to phase detector 201 and phase detector 208 on line 129.

Modulator 410 includes phase shifter 411, that can shift the phase of the signal on connection 216 by 90 degrees, and supplies outputs via connections 416 and 418 to mixers 412 and 414, respectively. The in-phase (I) component of the transmit signal is supplied via connection 421 to mixer 414 and the quadrature (Q) component of the signal is supplied via connection 422 to mixer 412. The output of mixer 414 is the modulated in-phase component of the transmit signal and is supplied on connection 423 to adder 426. The output of mixer 412 is the modulated quadrature component of the transmit signal and it is supplied on connection 424 to adder 426. Adder 426 supplies the combined modulated transmit signal via connection 428 to phase detector 201.

Similarly, modulator 440 includes phase shifter 441, that can shift the phase of the signal on connection 217 by 90 degrees, and supplies outputs via connections 448 and 449 to mixers 442 and 447, respectively. The in-phase (I) component of the transmit signal is supplied via connection 451 to mixer 447 and the quadrature (Q) component of the signal is supplied via connection 452 to mixer 442. The output of mixer 447 is the modulated in-phase component of the transmit signal and is supplied on connection 443 to adder 446. The output of mixer 442 is the modulated quadrature component of the transmit signal and it is supplied on connection 444 to adder 446. Adder 446 supplies the combined modulated transmit signal via connection 454 to phase detector 208. By placing modulators 410 and 440 in the translation loop of upconverter 400, the modulated signal represented by the I and Q signals on connections 422, 421, 452 and 451 is subtracted from the down-converted signal on lines 216 and 217, respectively, thus ensuring that the desired modulated signal is present at the output of TX VCO 207.

Figure 6:
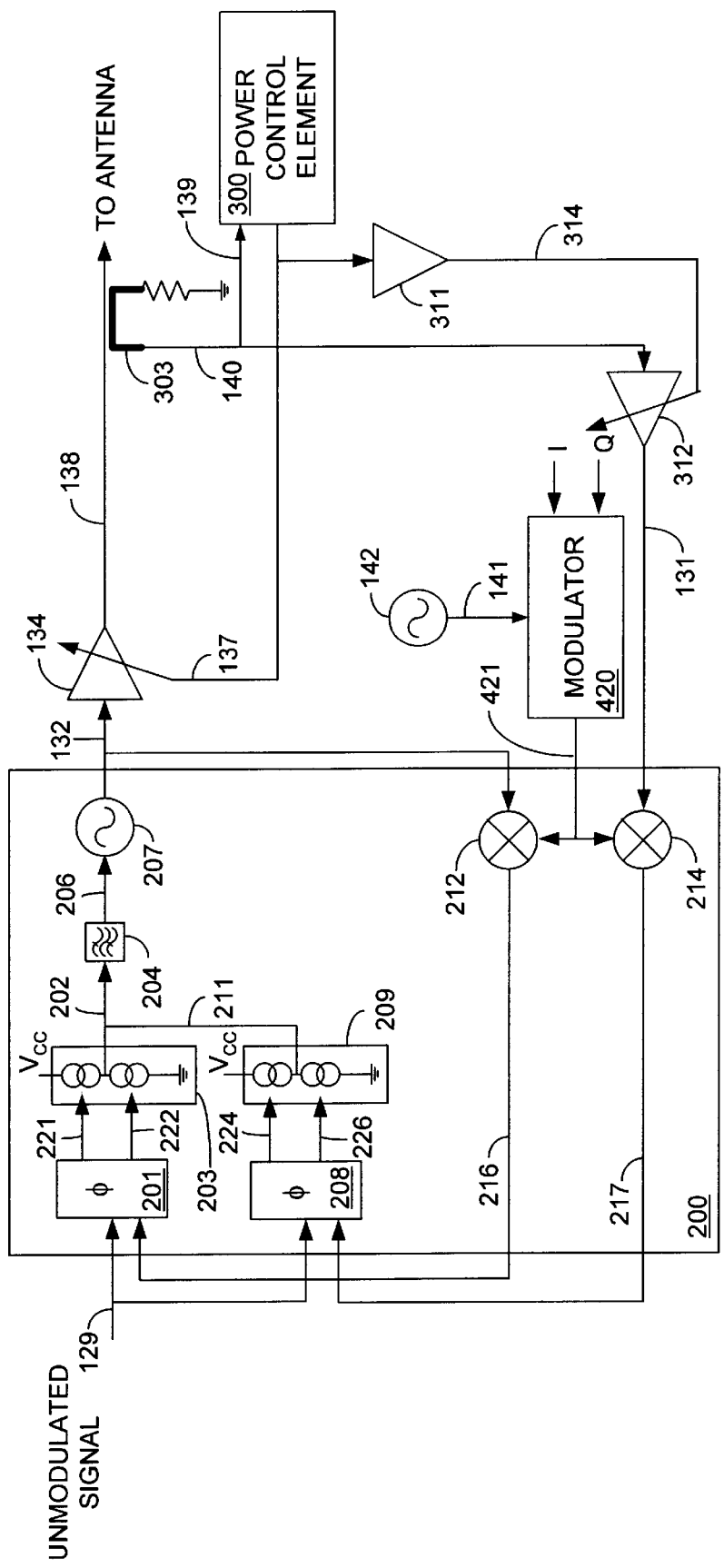
FIG. 6 is a block diagram illustrating another aspect of the upconverter of FIG. 2.

FIG. 6 is a block diagram illustrating another aspect of the upconverter 200 of FIG. 2. As illustrated in FIG. 6, modulator 420 is placed at the output of synthesizer 142 whereby the in-phase and quadrature components of the transmit signal are modulated in modulator 420 and supplied via connection 421 to mixers 212 and 214. In this manner, the modulated transmit signal is introduced into the translation loop of upconverter 200.

While various embodiments of the invention have been described, it will be apparent to those of ordinary skill in the art that many more embodiments and implementations are possible that are within the scope of this invention. For example, while illustrated using an I/Q modulator, the invention can work with any modulation technique. Accordingly, the invention is not to be restricted except in light of the attached claims and their equivalents.

What is claimed is:

1. A method for controlling the output of a power amplifier, comprising the steps of:
providing a modulated signal to an upconverter translation loop, the translation loop providing a frequency specific modulated signal;
providing the frequency specific modulated signal to a power amplifier;
using a portion of an output of the translation loop to develop a first feedback signal and a portion of an output of the power amplifier to develop a second feedback signal;
applying the first feedback signal to an input of the translation loop through a first phase detector during a first time period;
applying the second feedback signal to an input of the translation loop through a second phase detector during a second time period; and
controlling the first time period and the second time period using a first charge pump coupled to the output of the first phase detector and a second charge pump coupled to the output of the second phase detector.

2. The method of claim 1, wherein the first feedback signal, the first phase detector and the first charge pump form a first feedback loop.

3. The method of claim 1, wherein the second feedback signal, the second phase detector and the second charge pump form a second feedback loop.

4. The method of claim 3, further comprising the step of using an inverted version of the output of a power control element as input to a feedback amplifier as additional input to the second feedback loop.

5. The method of claim 1, wherein the modulated signal is a phase modulated signal.

6. The method of claim 1, further comprising the steps of:
measuring a first phase difference between the modulated signal and the first feedback signal using the first phase detector; and
using the first phase difference to control the output of the first charge pump.

7. The method of claim 1, further comprising the steps of:
measuring a second phase difference between the modulated signal and the second feedback signal fed back using the second phase detector; and
using the second phase difference to control the output of the second charge pump.

8. The method of claim 1, wherein the first time period and the second time period overlap.

9. The method of claim 1, further comprising the step of operating the first charge pump and the second charge pump so that the sum of the output pulse currents of the first charge pump and the second charge pump remains constant.

10. The method of claim 1, further comprising the step of operating the first charge pump and the second charge pump so that the sum of the output pulse currents of the first charge pump and the second charge pump varies.

11. A system for controlling the output of a power amplifier, comprising:
an upconverter translation loop, the upconverter translation loop including a first phase detector and a second phase detector, the upconverter translation loop also configured to provide a frequency specific modulated signal;
a power amplifier configured to receive the frequency specific modulated signal;
the first phase detector configured to receive a first feedback signal developed from an output portion of the translation loop;
the second phase detector configured to receive a second feedback signal developed from an output portion of the power amplifier;
a first charge pump configured to receive the output of the first phase detector during a first time period; and
a second charge pump configured to receive the output of the second phase detector during a second time period, wherein the first time period and the second time period are controlled using the first charge pump and the second charge pump.

12. The system of claim 11, wherein the first feedback signal, the first phase detector and the first charge pump form a first feedback loop.

13. The system of claim 11, wherein the second feedback signal the second phase detector and the second charge pump form a second feedback loop.

14. The system of claim 13, further comprising:
a power control element; and
a feedback amplifier configured to supply an inverted version of the output of the power control element as additional input to the second feedback loop.

15. The system of claim 11, wherein the modulated signal is a phase modulated signal.

16. The system of claim 11, wherein the first phase detector is configured to measure a first phase difference between the modulated signal and the first feedback signal, and wherein the first phase difference is used to control the output of the first charge pump.

17. The system of claim 11, wherein the second phase detector is configured to measure a second phase difference between the modulated signal and the second feedback signal, and wherein the second phase difference is used to control the output of the second charge pump.

18. The system of claim 11, wherein the first time period and the second time period overlap.

19. The system of claim 11, wherein the sum of the output pulse currents of the first charge pump and the second charge pump remains constant.

20. The system of claim 11, wherein the sum of the output pulse currents of the first charge pump and the second charge pump varies.

21. A computer readable medium having a program for controlling the output of a power amplifier, the program comprising logic configured to perform the steps of:
providing a modulated signal to an upconverter translation loop, the translation loop providing a frequency specific modulated signal;
providing the frequency specific modulated signal to a power amplifier;
using a portion of an output of the translation loop to develop a first feedback signal and a portion of an output of the power amplifier to develop a second feedback signal;
applying the first feedback signal to an input of the translation loop through a first phase detector during a first time period;
applying the second feedback signal to an input of the translation loop through a second phase detector during a second time period; and
controlling the first time period and the second time period using a first charge pump coupled to the output of the first phase detector and a second charge pump coupled to the output of the second phase detector.

22. The computer readable medium of claim 21, wherein the first feedback signal, the first phase detector and the first charge pump form a first feedback loop.

23. The computer readable medium of claim 21, wherein the second feedback signal, the second phase detector and the second charge pump form a second feedback loop.

24. The computer readable medium of claim 23, further comprising logic configured to perform the step of using an inverted version of the output of a power control element as input to a feedback amplifier as additional input to the second feedback loop.

25. The computer readable medium of claim 21, wherein the modulated signal is a phase modulated signal.

26. The computer readable medium of claim 21, further comprising logic configured to perform the steps of:
measuring a first phase difference between the modulated signal and the first feedback signal using the first phase detector; and
using the first phase difference to control the output of the first charge pump.

27. The computer readable medium of claim 21, further comprising logic configured to perform the steps of:

measuring a second phase difference between the modulated signal and the second feedback signal using the second phase detector; and using the second phase difference to control the output of the second charge pump.

28. The computer readable medium of claim 21, wherein the first time period and the second time period overlap.

29. The computer readable medium of claim 21, further comprising logic configured to perform the step of operating the first charge pump and the second charge pump so that the sum of the output pulse currents of the first charge pump and the second charge pump remains constant.

30. The computer readable medium of claim 21, further comprising logic configured to perform the step of operating the first charge pump and the second charge pump so that the sum of the output pulse currents of the first charge pump and the second charge pump varies.

31. A system for controlling the output of a power amplifier, comprising:

means for providing a modulated signal to an upconverter translation loop, the translation loop providing a frequency specific modulated signal;

means for providing the frequency specific modulated signal to a power amplifier;

means for using a portion of an output of the translation loop to develop a first feedback signal and a portion of an output of the power amplifier to develop a second feedback signal;

means for applying the first feedback signal to an input of the translation loop through a first phase detector during a first time period;

means for applying the second feedback signal to an input of the translation loop through a second phase detector during a second time period; and means for controlling the first time period and the second time period using a first charge pump coupled to the output of the first phase detector and a second charge pump coupled to the output of the second phase detector.

32. The system of claim 31, wherein the first feedback signal, the first phase detector and the first charge pump form a first feedback loop.

33. The system of claim 31, wherein the second feedback signal, the second phase detector and the second charge pump form a second feedback loop.

34. The system of claim 33, further comprising means for using an inverted version of the output of a power control element as input to a feedback amplifier as additional input to the second feedback loop.

35. The system of claim 31, wherein the modulated signal is a phase modulated signal.

36. The system of claim 31, further comprising:

means for measuring a first phase difference between the modulated signal and the first feedback signal using the first phase detector; and means for using the first phase difference to control the output of the first charge pump.

37. The system of claim 31, further comprising:

means for measuring a second phase difference between the modulated signal and the second feedback signal fed back using the second phase detector; and means for using the second phase difference to control the output of the second charge pump.

38. The system of claim 31, wherein the first time period and the second time period overlap.

39. The system of claim 31, further comprising means for operating the first charge pump and the second charge pump so that the sum of the output pulse currents of the first charge pump and the second charge pump remains constant.

40. The system of claim 31, further comprising means for operating the first charge pump and the second charge pump so that the sum of the output pulse currents of the first charge pump and the second charge pump varies.

* * * * *